United States Patent [19]

Ying

[11] Patent Number: 5,753,547

[45] Date of Patent: May 19, 1998

[54] FORMATION OF A CYLINDRICAL POLYSILICON MODULE IN DRAM TECHNOLOGY

[75] Inventor: Tse-Liang Ying, Hsin-Chu, Taiwan

[73] Assignee: Taiwan Semiconductor Manufacturing Company, Ltd., Hsin-Chu, Taiwan

[21] Appl. No.: 789,238

[22] Filed: Jan. 28, 1997

[51] Int. Cl.$^6$ .............................................. H01L 21/8242
[52] U.S. Cl. ................................................ 438/253; 438/631
[58] Field of Search ................................ 438/253, 396, 438/626, 631, 634

[56] References Cited

U.S. PATENT DOCUMENTS

| | | | |
|---|---|---|---|
| 5,185,282 | 2/1993 | Lee et al. | 437/47 |
| 5,236,859 | 8/1993 | Bae et al. | 437/52 |
| 5,250,472 | 10/1993 | Chen et al. | 438/631 |
| 5,279,983 | 1/1994 | Ahn | 438/253 |
| 5,498,562 | 3/1996 | Dennison et al. | 437/52 |
| 5,500,384 | 3/1996 | Melzner | 438/631 |
| 5,516,719 | 5/1996 | Ryou | 437/60 |
| 5,543,346 | 8/1996 | Keum et al. | 437/52 |

Primary Examiner—Chandra Chaudhari
Attorney, Agent, or Firm—George O. Saile; Stephen B. Ackerman; William J. Stoffel

[57] ABSTRACT

The present invention provides a method of manufacturing a stacked cylindrical capacitor having a smooth top cylindrical surface and uniform height. A first insulating layer 20 is formed over the substrate 10. A barrier layer 22 having an opening 23 is formed over a first insulating layer 20 on a substrate. A second insulating layer 24 composed of silicon oxide is formed on the barrier layer 22. The second insulating layer 24 and the first insulating layer 20 are patterned forming a first cylindrical opening 26 exposing the active region of the substrate 10 and forming a second cylindrical opening 30 in the second insulating layer 24 that exposes portions of the barrier layer 22. A conformal polysilicon layer 34 is formed over the resultant surface and the walls of the cylindrical openings 26 30. A planarizing layer 36 is formed over the resulting surface and then etched back forming a planarizing plug 36A that partially fills the second cylindrical opening 30A. A third insulation layer 40 is formed over resultant surface. The third insulating layer 40 and the polysilicon layer 34 are isotropically etched back forming a cylindrical bottom electrode 44 with a smooth top surface 44A. The smooth top electrode surface 44A increases the breakdown voltage to the capacitor.

20 Claims, 6 Drawing Sheets

FORMATION OF A CYLINDRICAL POLYSILICON MODULE IN DRAM TECHNOLOGY

BACKGROUND OF INVENTION

1) Field of the Invention

This invention relates generally to the fabrication of capacitors in semiconductor memory devices and more particularly to the manufacture of cylindrical capacitors for dynamic random access memory (DRAM) semiconductor devices.

2) Description of the Prior Art

Semiconductor device manufactures are continually pressured to increase effective device densities in order to remain cost competitive. As a result, Very Large Scale Integration (VLSI) and Ultra Large Scale Integration (ULSI) technologies have entered the sub-micron realm of structural dimension and now are approaching physical limits in the nanometer feature size range. In the near future, absolute atomic physical limits will be reached in the conventional two-dimensional approach to semiconductor device design. Traditionally, dynamic random access memory (DRAM) designers have faced the severest of challenges in advancing technologies. For example, designers of 64K DRAMs were perplexed to learn that a practical physical limit to charge capacity of storage capacitors had already been reached due to the minimum charge necessary to sense signals in the presence of environmental or particulate radiation inherently present in fabrication materials. Storage capacitors in the range of 50 femtofarads are now considered to be a physical limit. From a practical view, this limitation prevented the scaling of DRAM capacitors. Reduction of the surface area of a semiconductor substrate utilized by the storage capacitor has also been severely restricted. Large DRAM devices are normally silicon based, and each cell typically embodies a single MOS field effect transistor with its source connected to a storage capacitor. This large integration of DRAMs has been accomplished by a reduction in individual cell size. However, a decrease in storage capacitance, which results from the reduction in cell size, leads to draw backs, such as a lowering source/drain ratio and undesirable signal problems in terms of reliability.

Due to decreases in the thickness of capacitor materials, existing 1 Megabit (1 MBit) DRAM technologies utilize a planar device in circuit design. Beginning with 4 MBit DRAMs, the world of three-dimensional design has been explored to the extent that the simple single device/capacitor memory cell has been altered to provide the capacitor in a vertical dimension. In such designs the capacitor has been formed in a trench in the surface of the semiconductor substrate. In yet denser designs, other forms of capacitor design are proposed, such as stacking the capacitor above the transfer device.

There are two main approaches in producing capacitors for DRAM's, some manufacturers pursuing trench capacitors built into the crystalline silicon wafer, and other manufacturers pursuing stacked capacitors in which the capacitor is fabricated on top of the wafer surface. In the case of the trench capacitor, its extendibility is in doubt since it is extremely difficult to etch about 0.15–0.25 micrometer wide trenches well over 10 micrometers deep, as well as to then fabricate ultra thin dielectric layers on the trench surface, fill the trench, etc. On the other hand, the use of a stacked capacitor permits a variety of new process options, for example, in the choice of electrode material (polysilicon, silicide, etc.).

A stacked capacitor is fabricated by forming the stacked capacitor structures laying over the gate electrode on active, field oxide, and diffusion regions. The processing of such structures has become very complicated and require lithography and etching steps that are not in step with the very small dimensions required in the present and future state of the art.

Although there has been much work done in accomplishing these small size devices and increased capacitance therein, there is still great need for devices with even greater capacitance for a given 10 space in order to achieve even greater packing densities and improve the DRAM products of the future.

In the stacked cylindrical DRAM process, cylindrical polysilicon formation is required to obtain additional capacitance. The critical step is to form the smoother polysilicon cylindrical top surface and good uniformity of the cylindrical height without chemical-mechanical polish (CMP). The chemical-mechanical polish (CMP) process is a conventional approach, but it has a high cost and is complicated. Therefore, there is a need to for a method of forming a smooth polysilicon surface and a uniform cylinder height using a less complex process and less expensive process.

Efforts to maintain or increase the storage capacitance in memory cells with greater packing densities is evident in the following U.S. patents. U.S. Pat. No. 5,498,562 (Dennision et al.) shows a stacked capacitor where the top of the bottom electrode is removed by a CMP process. U.S. Pat. No. 5,516,719 (Ryou) and U.S. Pat. No. 5,543,346 (Keum et al.) show a methods of making capacitors. U.S. Pat. No. 5,285, 282 (Lee et al.) and U.S. Pat. No. 5,236,859 (Bae, et al.) show method of forming stacked capacitors.

However, a need continues to exist in the art for an lower cost and less complex method to manufacture stacked capacitor having smoother top surfaces and more uniform polysilicon cylinder heights.

SUMMARY OF THE INVENTION

It is an object of the present invention to provide a method for fabricating a cylindrical polysilicon stacked capacitor which has a smooth top cylindrical surface and a uniform cylinder height.

It is another object of the present invention to provide a low cost, advanced etch back method for fabricating a cylindrical polysilicon stacked capacitor which has a smooth top cylindrical surface and a uniform cylinder height.

To accomplish the above objectives, the present invention provides a method of manufacturing a cylindrical capacitor for a DRAM which is characterized as follows:

a) providing spaced field oxide regions 12 on a substrate 10, the substrate 10 having active regions surrounded by the spaced field oxide regions 12 on the substrate 10;

b) forming a first insulating layer 20 preferably composed of silicon oxide over the substrate 10;

c) forming a barrier layer 22 preferably composed of silicon nitride over the first insulating layer 20, the barrier layer 22 having an opening 23 over the active regions on the substrate 10;

d) forming a second insulating layer 24 preferably composed of silicon oxide on the barrier layer 22;

e) patterning the second insulating layer 24 and the first insulating layer 20 forming a first cylindrical opening 26 exposing the active region of the substrate 10 and forming a second cylindrical opening 30 in the second insulating layer 24 exposing portions of the barrier layer 22;

f) chemically cleaning the surfaces of the substrate 10, the first insulating layer 20, the barrier layer 22 and the second insulating layer 24;

g) forming a conformal polysilicon layer 34 on the substrate 10, the first insulating layer 20, the barrier layer 22, and the second insulating layer 24, the polysilicon layer 34 forming a first polysilicon cylindrical opening 26A in the first insulating layer 20 and the barrier layer 22 and defining a second polysilicon cylindrical opening 30A in the second insulating layer 24;

h) forming a planarizing layer (e.g., spin on glass ) 36 on the polysilicon layer 34, the spin on glass layer 36 filling the first cylindrical opening 26A and the second cylindrical opening 30A;

i) etching the spin on glass layer 36 forming a spin on glass plug 36A in the first cylindrical opening 26A and partially filling the second cylindrical opening 30A, the spin on glass plug 36A having a top surface that is lower than the top surface of the second insulating layer 24;

j) forming a third insulation layer 40 preferably composed of silicon oxide over the polysilicon layer 34 and over the spin on glass plug 36A;

k) etching the third insulating layer 40, the etch leaving a third insulating layer plug 40A on the spin on glass plug 36A in the second cylindrical opening 30A, and in-situ etching and removing the conformal polysilicon layer 22 on the top surface of the second insulating layer 24 forming a cylindrical bottom electrode 44 in an oxide etcher;

l) removing the third insulating layer plug 40A, the second insulating layer 24 and the spin on glass plug 36A; and m) forming a capacitor dielectric layer 50 and a top electrode 52 over the bottom electrode 44 forming a cylindrical capacitor.

The process of the present invention has two important features that combine to form a cylindrical stacked capacitor having a smooth top cylindrical surface 44A. First, in the etchback step (step k) the third insulating layer 40, the SOG plug 36A and the conformal polysilicon layer 22 are all etched back (e.g., isotropically) at about the same rate. The dry etch back (step k) creates a smooth top cylindrical surface 44A that increases the breakdown voltage of the capacitor. Second, the cylinder height is uniform because the third insulating layer 40 is planar and the etch back (steps h and k) creates a planar cylinder. The third insulating layer 40 is planar because the planarizing (e.g., spin on glass) plug 36A fills the cylindrical opening 30. The planarizing plug 36A ensures that the third insulating layer 40 is smooth when the third insulating layer 40 and the poly layer 34 are etched. The smooth top surface of the third insulating layer is transferred, during the etchback, to the top surface 44A of the polysilicon layer 40 thus increasing the breakdown voltage of the capacitor.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method of forming a DRAM having a stacked capacitor which has small dimension, high capacitance, smooth top cylinder surface and uniform height. The process for forming the field oxide (FOX) and the field effect transistor structure as presently practiced in manufacturing DRAM cells are only briefly described in order to better understand the current invention. It should be will be understood by one skilled in the art that by including additional process step not described in this embodiment, other types of devices can also be included on the DRAM chip. For example, P wells in the P substrate and CMOS circuits can be formed therefrom. It should also be understood that the figures depict only one DRAM storage cell out of a multitude of cells that are fabricated simultaneously on the substrate. Also, the capacitor can be used in other chip types in addition to DRAM chips. It should be also understood that the figures depict only one DRAM storage cell out of a multitude of cells that are fabricated simultaneously on the substrate.

Figure 1:
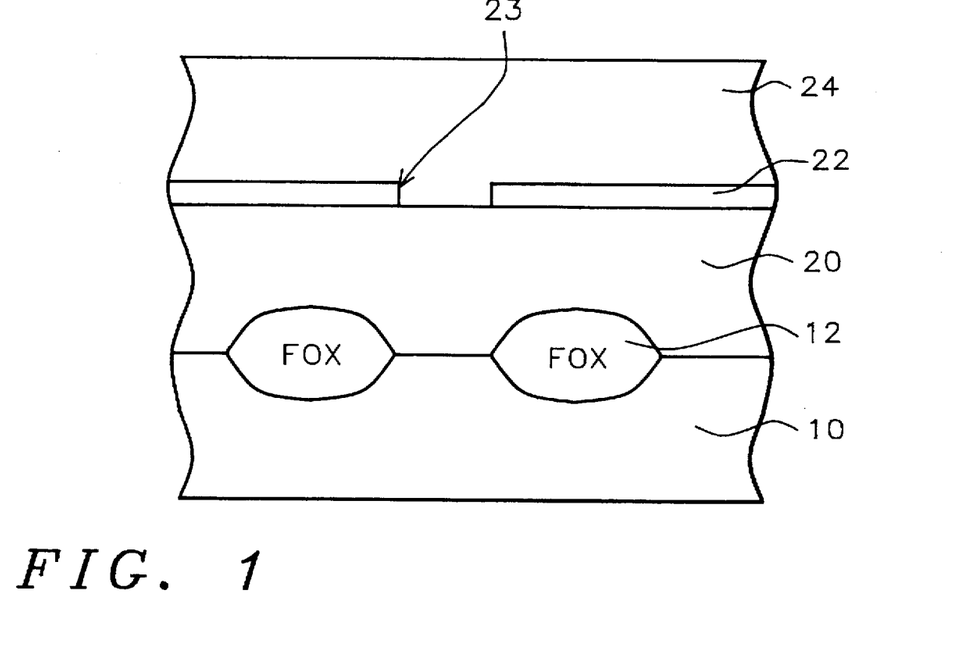
FIGS. 1 through 9 are cross sectional views for illustrating a method for manufacturing a cylindrical stacked capacitor according to the present invention.

As shown in FIG. 1, spaced field oxide regions 12 are provided on a substrate 10. The substrate 10 has active regions surrounded by the spaced field oxide regions 12. A silicon semiconductor substrate is provided that preferably has a (100) crystal orientation and a p-type background doping.

One method of forming the field oxide regions is describe by E. Kooi in U. S. Pat. No. 3,970,486, wherein selected surface portions of a silicon substrate are masked against oxidation and the unmasked surface is oxidized to grow a thermal oxide which in effect sinks into the silicon surface at the unmasked areas. The mask is removed and semiconductor devices can be formed in the openings between the isolation regions. The field oxide regions 12 preferably have a thickness in a range of between about 1000 and 6000 Å.

Still referring to FIG. 1, a first insulating layer 20 is formed over the substrate 10. The first insulation layer 20 is preferably composed of silicon oxide, borophosphosilicate glass (BPSG) or BPSG formed using Tetraethylorthosilicate (BPTEOS) and is more preferably composed of silicon oxide. The first insulating layer 20 can be formed by a TEOS process and preferably has a thickness in a range of between about 1000 and 6000 Å.

Next, a barrier layer 22 is formed over the first insulating layer 20. The barrier layer is preferably composed of silicon nitride, or oxynitride and is more preferably composed of silicon nitride. It is important that the barrier layer has different etch characteristics than the first 20 or second insulating 24 layers. The barrier layer 22 preferably has a thickness in a range of between about 50 and 3000 Å.

The barrier layer 22 has an opening 23 over the active regions on the substrate 10. The opening 23 preferably has a width in a range of between about 0.2 and 0.8 μm and more preferably in a range of between about 0.2 and 0.4 μm.

Subsequently, a second insulating layer 24 on the barrier layer 22. The second insulating layer 24 is preferably composed of silicon oxide, BPSG or BPTEOS and is more preferably composed of silicon oxide. The second insulating layer 24 preferably has a thickness in a range of between about 1000 and 6000 Å and more preferably between about 3000 and 4000 Å. The second insulating layer 24 has a thickness to that defines the height of the polysilicon cylinder.

Figure 2:
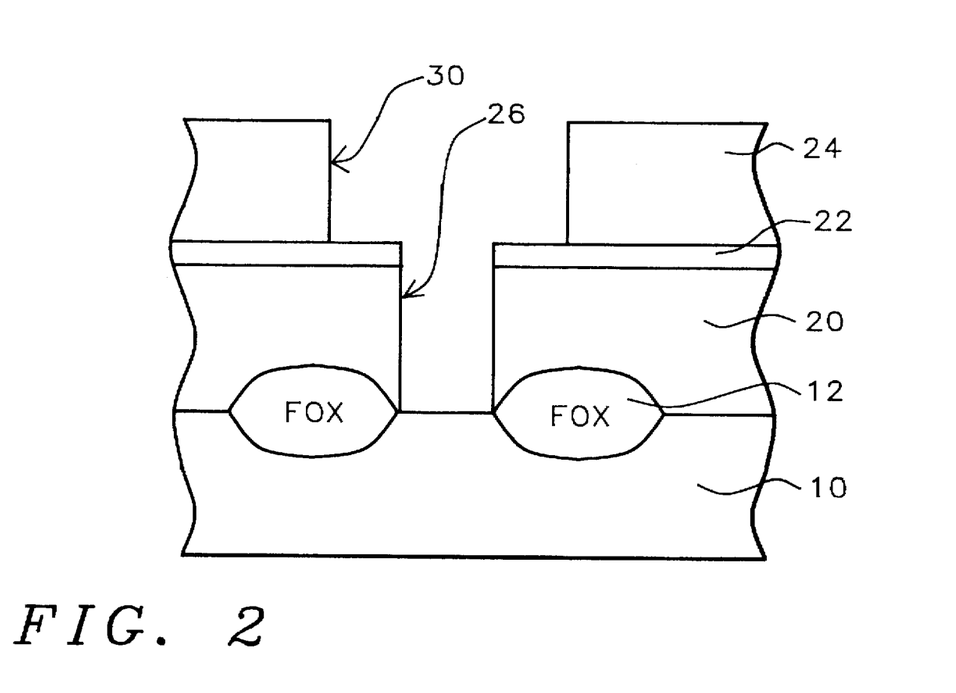

As shown in FIG. 2, the second insulating layer 24 and the first insulating layer 20 are patterned forming a first cylindrical opening 26 exposing the active region of the substrate 10 and forming a second cylindrical opening 30 in the second insulating layer 24 exposing portions of the barrier layer 22.

The patterning of the second insulating layer and the first insulating layer comprises forming a first photoresist layer (not shown) having a first photoresist opening defining the first cylindrical opening 26. The second insulating layer 24 is reactive ion (or plasma) etched forming the second cylindrical opening 30 and using the barrier layer as an etch mask. The first insulating layer 20 is reactive ion etched forming the first cylindrical opening 26.

Next, the surfaces of the substrate 10, the first insulating layer 20, the barrier layer 22 and the second insulating layer 24 are chemically cleaned. The preferred clean is a B clean comprising APM, SPM and HF. The B clean has the advantage of removing particles and the native oxide of the contact.

Figure 3:
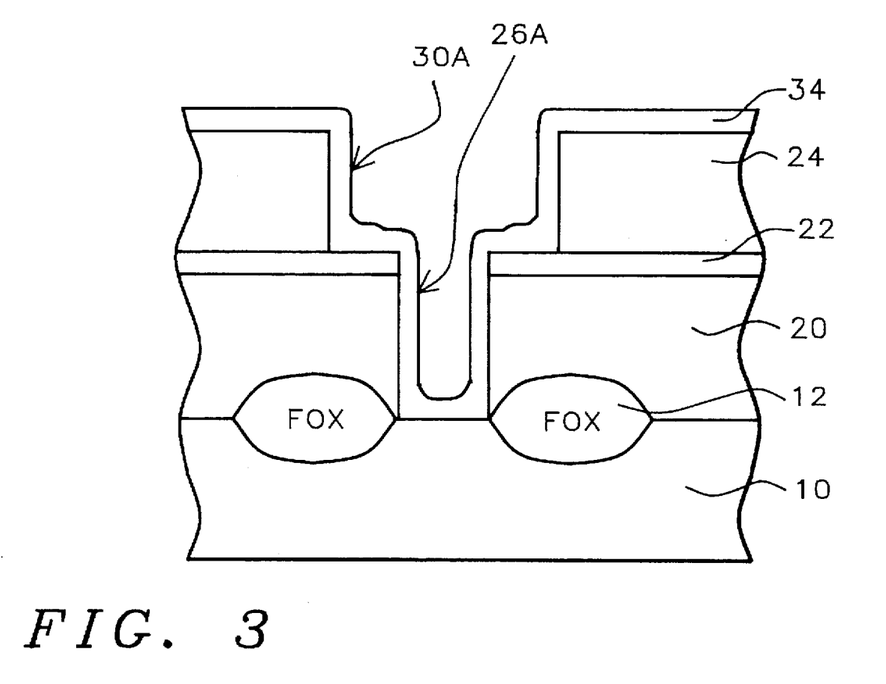

As shown in FIG. 3, a conformal polysilicon layer 34 is formed over the substrate 10, the first insulating layer 20, the barrier layer 22, and the second insulating layer 24. The polysilicon layer 34 forms a first polysilicon cylindrical opening 26A in the first insulating layer 20 and the barrier layer 22 and defines a second polysilicon cylindrical opening 30A in the second insulating layer 24.

The conformal polysilicon layer 34 preferably has a thickness in a range of between about 300 and 1500 Å and an impurity doping in a range of between about 1E15 and 1E22 atoms/cm$^3$.

Figure 4:
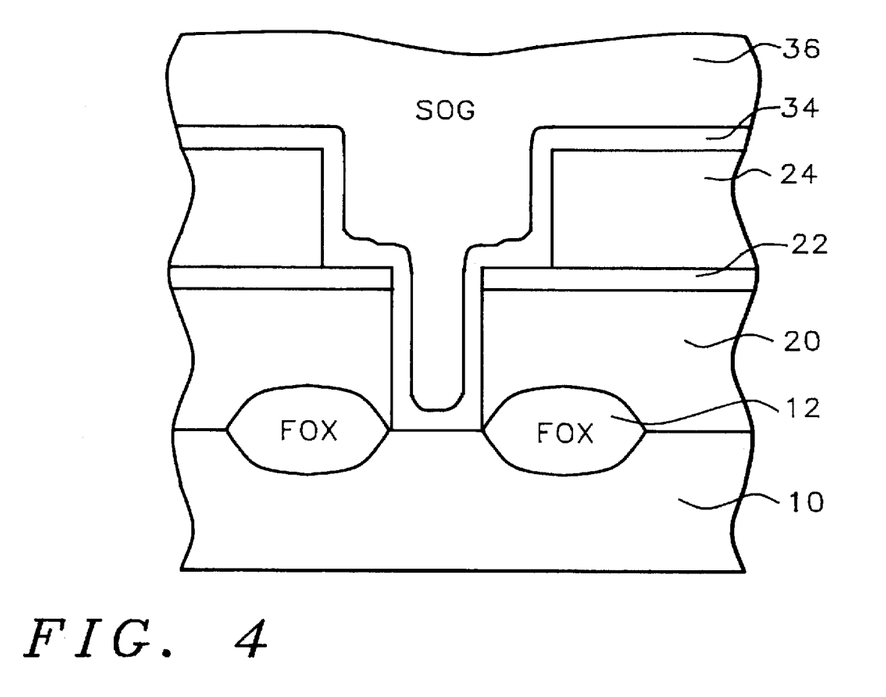

As shown in FIG. 4, a planarizing layer 36 (e.g., a spin on glass layer) is formed on the polysilicon layer 34. The planarizing layer 36 can be formed of a planarizing material, such a spin-on-glass, TEOS, TEOS-O$_3$ and is preferably formed of spin-on-glass. The planarizing layer 36 composed of SOG is coated and cured using conventional processes. For example, the spin on glass layer can be formed using a siloxane or silicate and more preferably a siloxane, which is deposited, baked and cured at approximately 400° C.

The planarizing layer 36 fills the first cylindrical opening 26A and the second cylindrical opening 30A. The planarizing layer 36 preferably has a thickness in a range of between about 3000 and 8000 Å.

Figure 5:
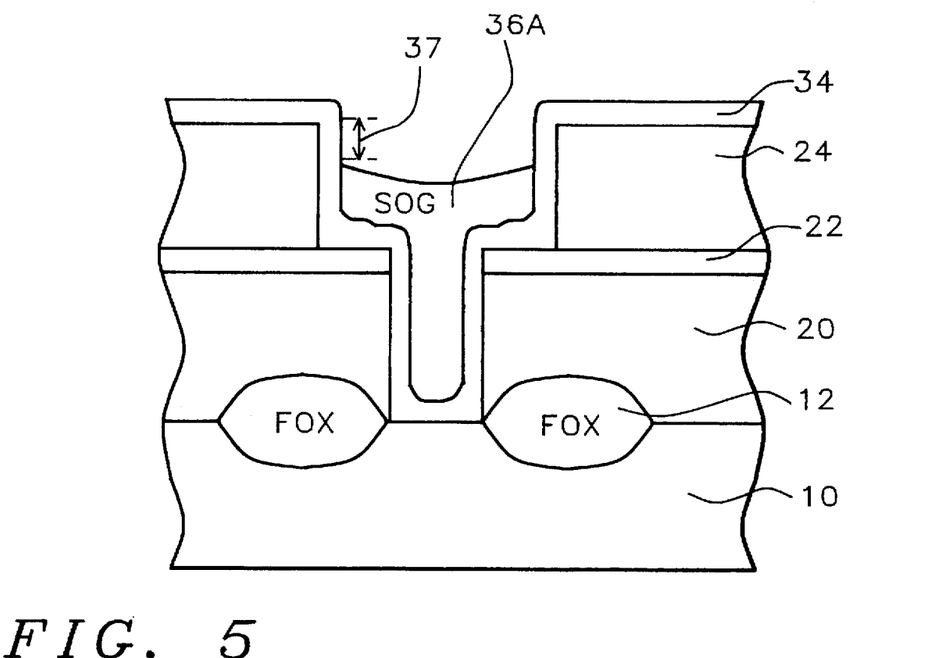

As shown in FIG. 5, the planarizing layer 36 is etched forming a planarizing plug 36A (e.g., a spin-on-glass plug 36A) in the first cylindrical opening 26A and partially fills the second cylindrical opening 30A. The planarizing plug 36A has a top surface that is lower than the top surface of the second insulating layer 24. The planarizing layer is preferably etched using a dry anisotropic etch selective to material of the planarizing layer over the material of the polysilicon layer. The etch selectivity of the etch rate of the of planarizing layer to the etch rate of the poly-silicon is preferably much greater than 1. The etching back of the planarizing layer 36 without etching the polysilicon layer 34 provides the following advantage. The polysilicon layer 34 along the second cylindrical opening 30A (upper portion) is not etched while the planarizing (e.g., SOG) layer is being etched out of the first cylindrical opening 26A. If the polysilicon layer 34 was etched, this would damage the polysilicon and reduce the capacitance/performance.

The planarizing plug 36A preferably has a thickness so that the top surface of the plug 36A is a distance 37 below the bottom of the polysilicon layer 34 (over the second insulating layer 24) in a range of between about 1500 and 3000 Å. See FIG. 5.

Figure 6:
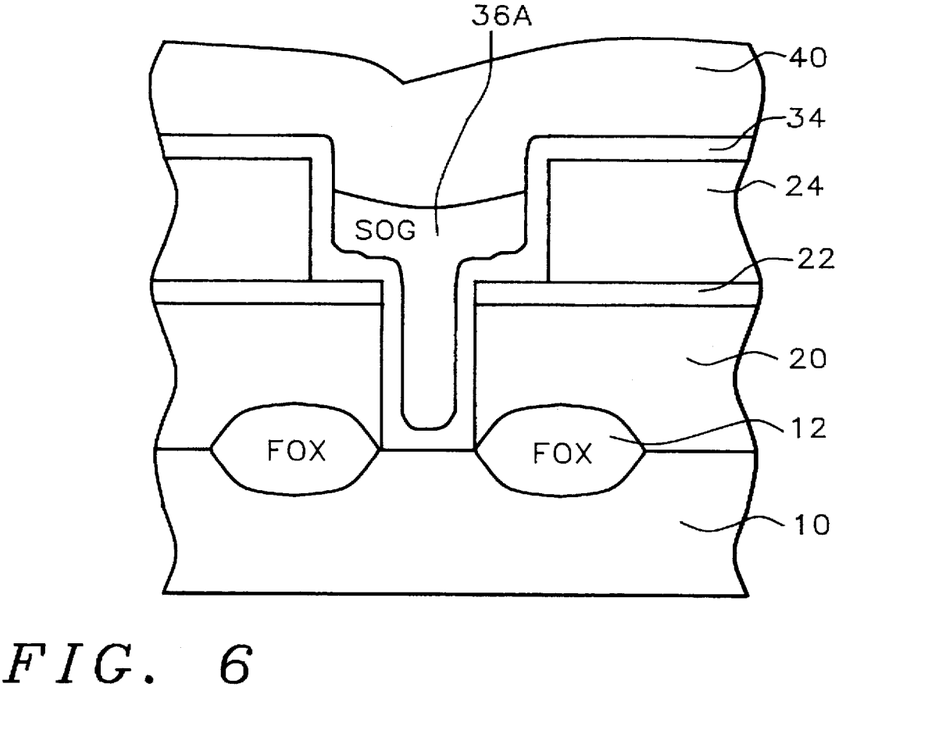

As shown in FIG. 6, a third insulation layer 40 is formed over the polysilicon layer 34 and over the spin on glass plug 36A. The third insulation layer 40 is preferably composed of silicon oxide, TEOS or PSG and is more preferably composed of silicon oxide. The third insulation layer 40 preferably has thickness in a range of between about 2000 and 12,000 Å. The third insulating layer is relatively planar because of the planarizing plug 36 that fills the cylindrical opening 30A 26A.

Figure 7:
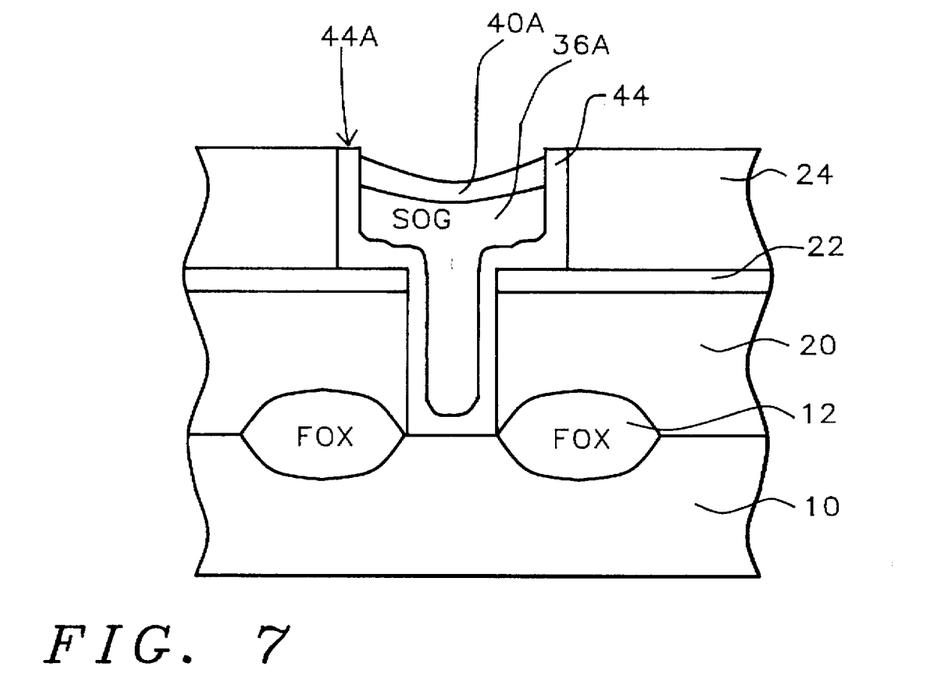

Turning to FIG. 7, in an important step, the third insulating layer 40 and the conformal polysilicon layer 22 on the top surface of the second insulating layer 24 are etched back forming a cylindrical bottom electrode 44. There are two embodiments of the etch. The etch can be a (1) one or (2) two step etch. The one step is uses preferably a dry isotropic etch which etches the third insulating layer 36, the second insulating layer 24 and the polysilicon layer 34 at about the same rate (e.g., ±10% and more preferably ±5%). The dry etch can comprise an anisotropic etch such as a reactive ion etch (RIE) with a fluorine gas, such as $CF_4$—$H_2$, $C_2F_6$, $C_2F_6$—$C_2H_4$, $C_3F_8$, $C_4F_8$, or $CHF_3$ or in combination with other gasses. The etch leaves a third insulating layer plug 40A on the spin on glass plug 36A in the second cylindrical opening 30A.

Figure 10:
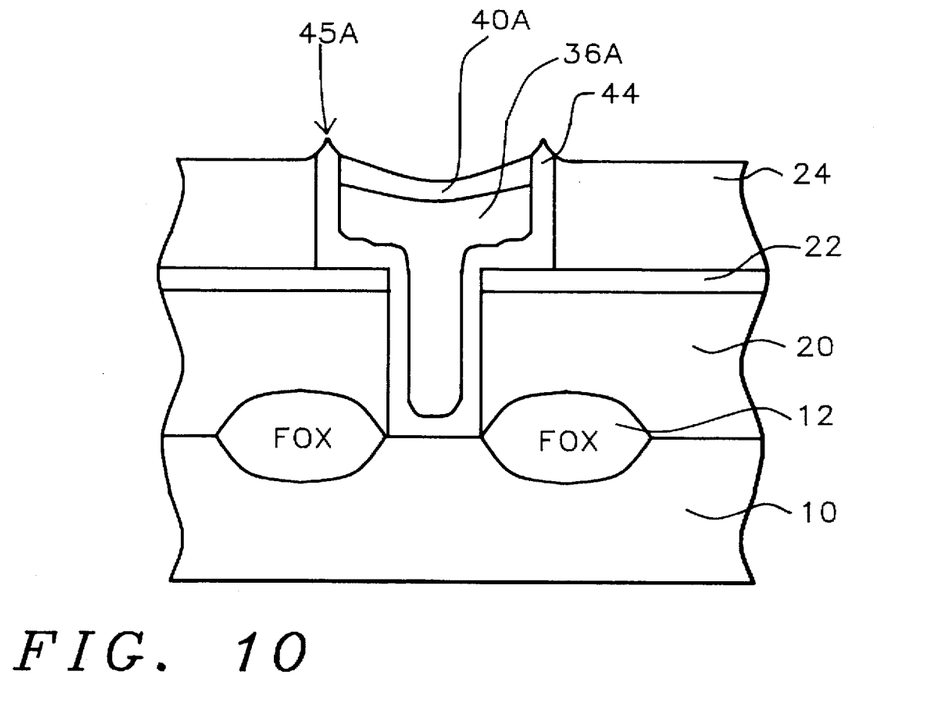
FIG. 10 is a cross sectional view for illustrating a cylindrical stacked capacitor with a sharp pointed top 45A which results when the third insulating layer 40 is etched back at a faster rate than the polysilicon layer 34.
Figure 11:
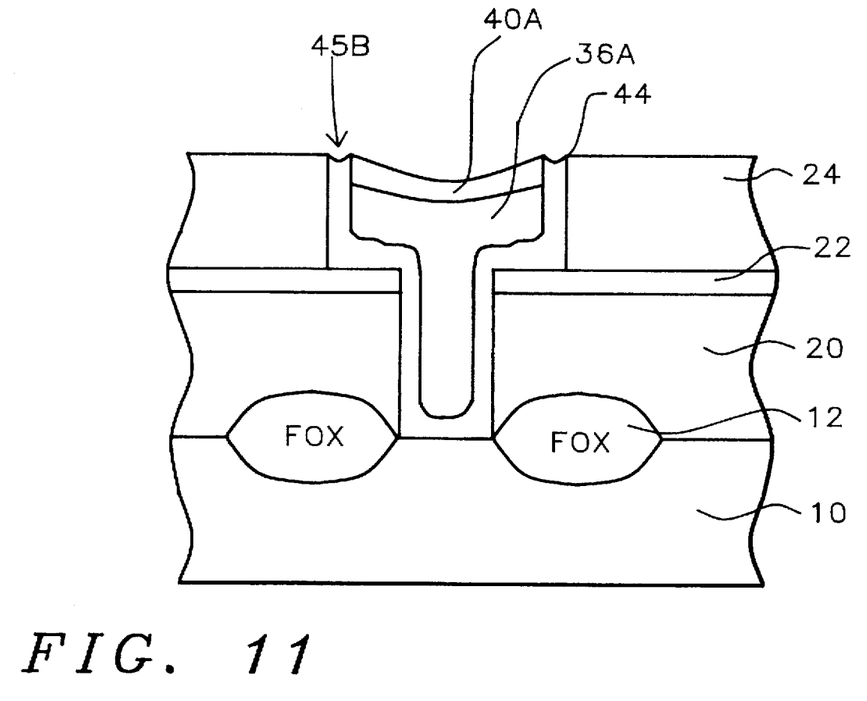
FIG. 11 is a cross sectional view for illustrating a cylindrical stacked capacitor with a sharp concave top 45B which results when the third insulating layer 40 is etched back at a slower rate than the polysilicon layer 34.

A two step etchback is preferred. In the two step etch, the first etch is preferably anisotropic, removes the third insulating layer over the polysilicon layer 34, and stops at the interface between the polysilicon layer 34 and the third insulation layer 40. The second etch is preferably an isotropic dry etch that etches the third insulation layer 40, the second insulating layer 24, and the polysilicon layer 34 at about the same rate (±10% and more preferably ±5%). The isotropic etch is important so that the top 44A of the cylindrical bottom electrode 44 is flat and smooth, not pointed or concave. The smooth polysilicon surface 44A lowers the breakdown voltage of the capacitor. See FIG. 7. FIG. 10 shows the case where the etchback etches oxide 40 faster than polysilicon layer 34 thus forming a sharp top 45A of the polysilicon cylinder 44 . FIG. 11 shows the case where the etchback etches polysilicon 34 faster than oxide 30 thus forming the concave sharp top 45b of the polysilicon cylinder 44. These pointed tops 45A 45B lower have lower breakdown voltages that the smooth top 44A of the invention. In addition, it is preferable the both the first and second etches are dry etches performed in the same etcher.

The third insulating layer plug 40A preferably has a thickness in a range of between about 1500 and 3000 Å.

Figure 8:
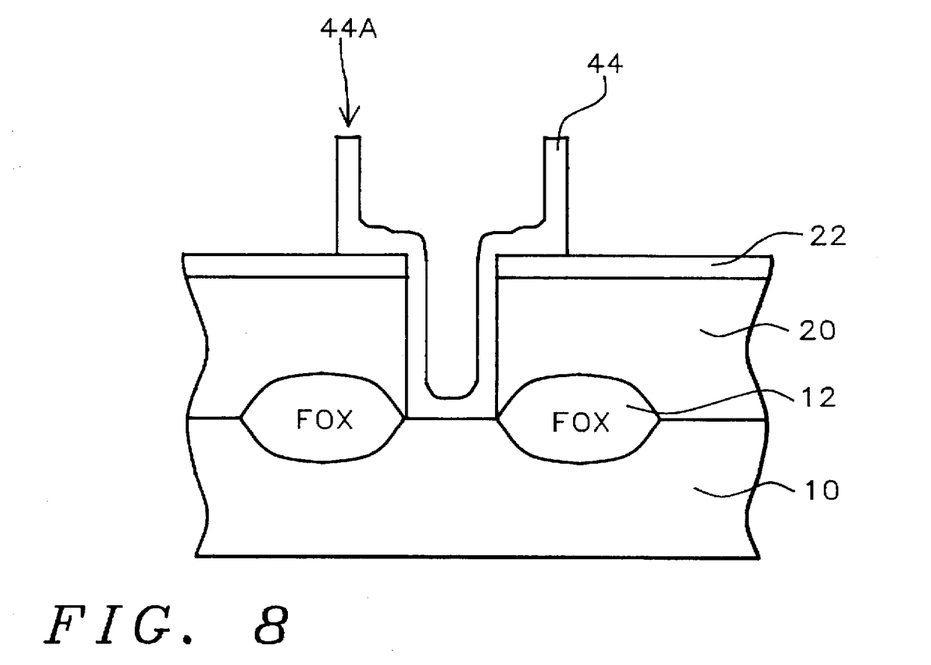

Referring to FIG. 8, the third insulating layer plug (cap) 40A, the second insulating layer 24, and the planarizing plug 36A are removed. The removal of the third insulating layer plug (cap) 40A, the second insulating layer 24, and the planarizing plug 36A is preferably performed by oxide etch.

Figure 9:
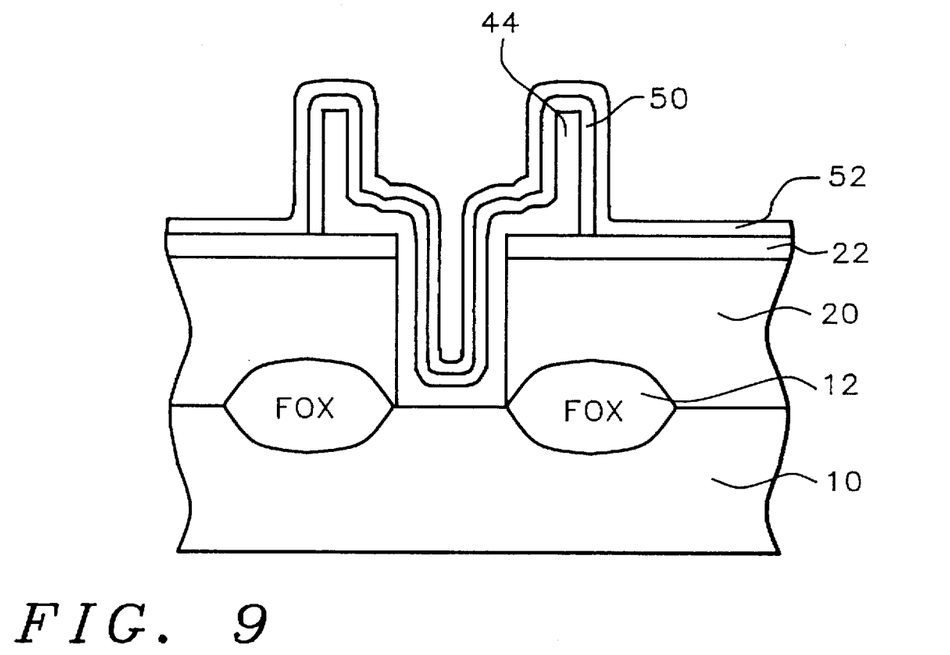

Turning to FIG. 9, the capacitor and DRAM are now completed by forming a capacitor dielectric layer 50 and a top electrode 52 over the bottom electrode 44 forming a cylindrical capacitor.

The process of the present invention has two important features that combine to form a cylindrical stacked capacitor having a smooth top cylindrical surface 44A. First, in the etchback step (step k) the third insulating layer 40, the SOG plug 36A and the conformal polysilicon layer 22 are all etched back (e.g., isotropically) at about the same rate. The dry etch back (step k) creates a smooth top cylindrical surface 44A that increases the breakdown voltage of the capacitor. Second, the cylinder height is uniform because the third insulating layer 40 is planar and the etch back (steps h and k) creates a planar surface. The third insulating layer 40 is planar because the planarizing (e.g., spin on glass) plug 36A fills the cylindrical opening 30. The planarizing plug 36A ensures that the third insulating layer 40 is smooth when the third insulating layer 40 and the poly layer 34 are etched. The smooth top surface of the third insulating layer is transferred, during the etchback, to the top surface 44A of the polysilicon layer 40 thus increasing the breakdown voltage of the capacitor.

As is obvious to one skilled in the art, in this description, the insulating layers 20 24 40 can be formed of sacrificial material including non-insulating materials.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a cylindrical polysilicon capacitor in a DRAM cell comprising:

a) providing spaced field oxide regions on a substrate, said substrate having active regions surrounded by said spaced field oxide regions on said substrate;

b) forming a first insulating layer over said substrate;

c) forming a barrier layer over said first insulating layer, said barrier layer having an opening over said active regions on said substrate;

d) forming a second insulating layer over said barrier layer;

e) patterning said second insulating layer and said first insulating layer forming a first cylindrical opening exposing said active region of said substrate and forming a second cylindrical opening in said second insulating layer exposing portions of said barrier layer;

f) forming a conformal polysilicon layer over said substrate, said first insulating layer, said barrier layer, and said second insulating layer;

g) forming a planarizing layer on said conformal polysilicon layer, said planarizing layer filling said first cylindrical opening and said second cylindrical opening;

h) etching said planarizing layer forming a planarizing plug in said first cylindrical opening and partially filling said second cylindrical opening, said planarizing plug having a top surface that is lower than the top surface of said second insulating layer;

i) forming a third insulation layer over said polysilicon layer and over said planarizing plug;

j) etching said third insulating layer and said conformal polysilicon layer, the etch leaving a third insulating layer plug over said planarizing plug in said second cylindrical opening, and etching and removing said conformal polysilicon layer on the top surface of said second insulating layer thus forming a cylindrical bottom electrode; and k) removing said third insulating layer plug, said second insulating layer, and said planarizing plug.

2. The method of claim 1 wherein step (j) the etch comprises a dry isotropic etch where the etch rate of said third insulating layer and said conformal polysilicon layer are within ±10%.

3. The method of claim 1 wherein step (j) the etch comprises a two step etch: the first etch step comprising a dry anisotropic etch, and the second etch step comprising a dry isotropic etch where the etch rate of said third insulating layer and said conformal polysilicon layer are within ±10%.

4. The method of claim 1 wherein step (j) said etch comprises a two step etch performed in an etcher; the etch first step comprising a dry anisotropic etch and stops at the top surface of said conformal polysilicon layer, and the second etch step comprising a dry isotropic etch; where the etch rates of the second insulating layer, said third insulating layer, and said conformal polysilicon layer are within about ±10% and said second insulating layer and said third insulation layer are formed of the same materials.

5. The method of claim 1 wherein step (j) said etch comprises a two step etch; the etch first step comprising a dry anisotropic etch and stops at the top surface of said conformal polysilicon layer; and the second etch step comprising a dry isotropic etch; where the etch rates of the second insulating layer, said third insulating layer, and said conformal polysilicon layer are within about ±10% and the two step etch is performed in a single etcher.

6. The method of claim 1 wherein said first insulating layer is formed by a TEOS process and has a thickness in a range of between about 1000 and 6000 Å; and said planarizing layer is composed of spin on glass; and said first insulating layer is composed of silicon oxide; and said barrier layer is composed of silicon nitride and said second insulating layer is composed of silicon oxide.

7. The method of claim 1 wherein said barrier layer has a thickness in a range of between about 50 and 3000 Å.

8. The method of claim 1 wherein said second insulating layer having a thickness in a range of between about 1000 and 6000 Å and where said second insulating layer has a thickness to that defines the height of said polysilicon cylinder.

9. The method of claim 1 wherein the patterning of said second insulating layer and said first insulating layer comprises forming a first photoresist layer having a first photoresist opening defining said first cylindrical opening and reactive ion etching said second insulating layer forming said second cylindrical opening; and using said barrier layer as an etch mask, reactive ion etching said first insulating layer forming said first cylindrical opening.

10. The method of claim 1 wherein said conformal polysilicon layer has a thickness in a range of between about 300 and 1500 Å and an impurity doping in a range of between about 1E15 and 1E22 atoms/cm$^3$ and said planarizing layer has a thickness in a range of between about 3000 and 8000 Å, and said third insulation layer is composes of the same material as said second insulating layer and has a thickness in a range of between about 200 and 12,000 Å and said third insulating layer plug having a thickness in a range of between about 1500 and 3000 Å.

11. A method of fabricating a cylindrical polysilicon capacitor in a DRAM cell comprising:

a) providing spaced field oxide regions on a substrate, said substrate having active regions surrounded by said spaced field oxide regions on said substrate;

b) forming a first insulating layer composed of silicon oxide over said substrate;

c) forming a barrier layer composed of silicon nitride over said first insulating layer, said barrier layer having an opening over said active regions on said substrate;

d) forming a second insulating layer composed of silicon oxide on said barrier layer;

e) patterning said second insulating layer and said first insulating layer forming a first cylindrical opening exposing said active region of said substrate and forming a second cylindrical opening in said second insulating layer exposing portions of said barrier layer;

f) forming a conformal polysilicon layer on said substrate, said first insulating layer, said barrier layer, and said second insulating layer;

g) forming a planarizing layer on said polysilicon layer, said planarizing layer filling said first cylindrical opening and said second cylindrical opening;

h) etching said planarizing layer forming a planarizing plug in said first cylindrical opening and partially filling said second cylindrical opening, said planarizing plug having a top surface that is lower than the top surface of said second insulating layer;

i) forming a third insulation layer composed of silicon oxide over said polysilicon layer and over said planarizing plug;

j) etching said third insulating layer, the etch leaving a third insulating layer plug on said planarizing plug, in said second cylindrical opening, and etching and removing said conformal polysilicon layer on the top surface of said second insulating layer forming a cylindrical bottom electrode; and k) removing said third insulating layer plug, said second insulating layer, and said planarizing plug.

12. The method of claim 11 wherein step (j) the etch comprises a dry isotropic etch where the etch rate of said third insulating layer and said conformal polysilicon layer are within ±10%.

13. The method of claim 11 wherein step (j) the etch comprises a two step etch: the first etch step comprising a dry anisotropic etch, and the second etch step comprising a dry isotropic etch where the etch rate of said third insulating layer and said conformal polysilicon layer are within ±10%.

14. The method of claim 11 wherein step (j) said etch comprises a two step etch performed in an etcher; the etch first step comprising a dry anisotropic etch and stops at the top surface of said conformal polysilicon layer, and the second etch step comprising a dry isotropic etch where the etch rates of said second insulating layer, said third insulating layer, and said conformal polysilicon layer are within about ±10% and said second insulating layer and said third insulation layer are formed of the same materials.

15. The method of claim 11 wherein step (j) said etch comprises a two step etch performed in an etcher; the etch first step comprising a dry anisotropic etch and stops at the top surface of said conformal polysilicon layer, and the second etch step comprising a dry isotropic etch where the etch rates of said second insulating layer, said third insulating layer, and said conformal polysilicon layer are within about ±10% and said second insulating layer and said third insulation layer are formed of the same materials.

16. The method of claim 11 wherein step (j) said etch comprises a two step etch; the etch first step comprising a dry anisotropic etch and stops at the top surface of said conformal polysilicon layer, and the second etch step comprising a dry isotropic etch where the etch rates of said second insulating layer, said third insulating layer, and said conformal polysilicon layer are within about ±10% and the two step etch is performed in a single etcher.

17. The method of claim 11 wherein said first insulating layer is formed by a TEOS process and has a thickness in a range of between about 1000 and 6000 Å and said planarizing layer is composed of spin on glass; and said second insulating layer having a thickness in a range of between about 1000 and 6000 Å and where said second insulating layer has a thickness to that defines the height of said polysilicon cylinder; and said conformal polysilicon layer having a thickness in a range of between about 300 and 1500 Å and an impurity doping in a range of between about 1E15 and 1E22 atoms/cm$^3$.

18. The method of claim 11 wherein said planarizing layer has a thickness in a range of between about 3000 and 8000 Å.

19. The method of claim 11 wherein said third insulation layer has a thickness in a range of between about 200 and 12,000 Å and said third insulating layer plug having a thickness in a range of between about 1500 and 3000 Å.

20. The method of claim 11 which further includes after step (e) chemically cleaning the surfaces of said substrate, said first insulating layer, said barrier layer and said second insulating layer.

* * * * *